(12) United States Patent
Coban

(10) Patent No.: US 10,715,156 B1
(45) Date of Patent: Jul. 14, 2020

(54) PLL FOR CONTINUOUS-TIME DELTA-SIGMA MODULATOR BASED ADCS

(71) Applicant: Silicon Laboratories Inc., Austin, TX (US)

(72) Inventor: Abdulkerim L. Coban, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/369,239

(22) Filed: Mar. 29, 2019

(51) Int. Cl.
*H03L 7/099* (2006.01)
*H03M 3/00* (2006.01)
*H03L 7/089* (2006.01)
*H03F 3/189* (2006.01)
*H03K 5/135* (2006.01)
*H02M 3/07* (2006.01)

(52) U.S. Cl.
CPC ........ *H03L 7/0996* (2013.01); *H03F 3/189* (2013.01); *H03K 5/135* (2013.01); *H03L 7/0891* (2013.01); *H03M 3/458* (2013.01); *H02M 3/07* (2013.01); *H03F 2200/451* (2013.01)

(58) Field of Classification Search
None
See application file for complete search history.

(56) References Cited

U.S. PATENT DOCUMENTS

| | | | | |
|---|---|---|---|---|
| 7,548,120 B2* | 6/2009 | Lam | | G06F 1/08 331/179 |
| 7,570,105 B1 | 8/2009 | Baek | | |
| 7,821,343 B1* | 10/2010 | Wong | | H03L 7/23 327/147 |
| 8,130,044 B2* | 3/2012 | Bereza | | H03L 7/18 331/167 |
| 2002/0145478 A1 | 10/2002 | Chang | | |
| 2004/0229574 A1* | 11/2004 | Pfann | | H04B 1/30 455/73 |
| 2006/0038596 A1* | 2/2006 | Wang | | H03L 7/0812 327/158 |

(Continued)

OTHER PUBLICATIONS

Larsson, P., "An Offset-Cancelled CMOS Clock-Recovery/Demux with a Half-Rate Linear Phase Detector for 2.5Gb/s Optical Communication," Bell Labs, ISSCC 2001 / Feb. 5, 2001, 3 pages.

(Continued)

*Primary Examiner* — Howard Williams
(74) *Attorney, Agent, or Firm* — Zagorin Cave LLP

(57) ABSTRACT

A phased-locked loop (PLL) includes a first oscillator supplying a first oscillator signal with a first jitter component and a second oscillator supplying a second oscillator signal with a second jitter component. The second jitter component is higher than the first jitter component. A selector circuit selects either the first oscillator signal or the second oscillator signal as the PLL output signal. The first oscillator signal and the second oscillator signal may have different frequencies with the lower frequency signal having more jitter. The oscillator producing the signal with less jitter utilizes more power. A continuous time delta-sigma modulator analog-to-digital converter (ADC) receives the PLL output signal as an input clock signal. A high gain setting of an amplifier supplying an input signal to the ADC selects a lower jitter signal input clock signal and a lower gain setting selects a higher jitter input clock signal.

16 Claims, 11 Drawing Sheets

(56) References Cited

U.S. PATENT DOCUMENTS

2010/0291891 A1* 11/2010 Ridgers .................. H03D 3/007
455/205
2016/0006442 A1 1/2016 Lahiri

OTHER PUBLICATIONS

Long, Prof. S., "Phase Locked Loop Circuits," UCSB/ECE Department, Apr. 27, 2005, downloaded from https://web.ece.ucsb.edu/~long/ece594a/PLL_intro_594a_s05.pdf, 46 pages.

Razavi, B., "Introduction to PLLs," Electrical Engineering Department, downloaded Mar. 7, 2019, from www.seas.ucla.edu/brweb/teaching/215C_W2013/PLLs.pdf, 30 pages.

Rives, M., "Intermediate Frequency (IF) Sampling Receiver Concepts," National Semiconductor, vol. IV, Issue 3, 2011, 6 pages.

Addo, R.F., "Charge Pumps for PLLs," downloaded from https://slideplayer.com/slide/5669461/, Mar. 13, 2019, 49 pages.

Cheng, S., et al., "Design and Analysis of an Ultrahigh-Speed Glitch-Free Fully Differential Charge Pump With Minimum Output Current Variation and Accurate Matching," IEEE Transactions on Circuits and Systems—II: Express Briefs, vol. 53, No. 9, Sep. 2006, pp. 843-847.

Kalenteridis, V., et al., "Analysis and Design of Charge Pumps for Telecommunication Applications," VLSI-SoC 2008, IFIP AICT 313, pp. 43-60, 2010.

Morgan, J., "Design of a Phase Frequency Detector and Charge Pump for a Phase-Locked Loop in 0.18 μm CMOS," Presented to the faculty of the Department of Electrical and Electronic Engineering California State University, Sacramento, Spring 2017, 41 pages.

U.S. Appl. No. 16/369,249, filed Mar. 29, 2019, entitled "Charge Pump and Active Loop Filter With Shared Unity Gain Buffer," to inventor Abdulkerim L. Coban.

* cited by examiner

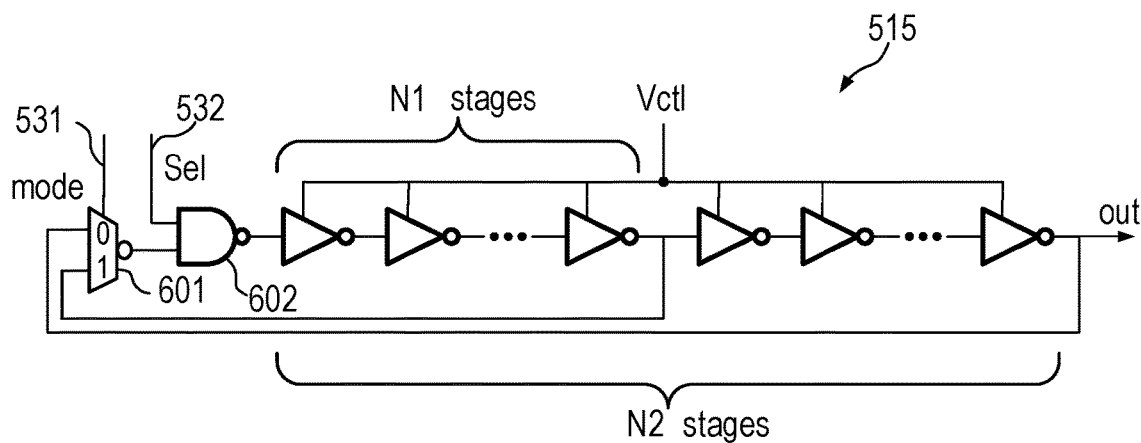
Fig. 6a
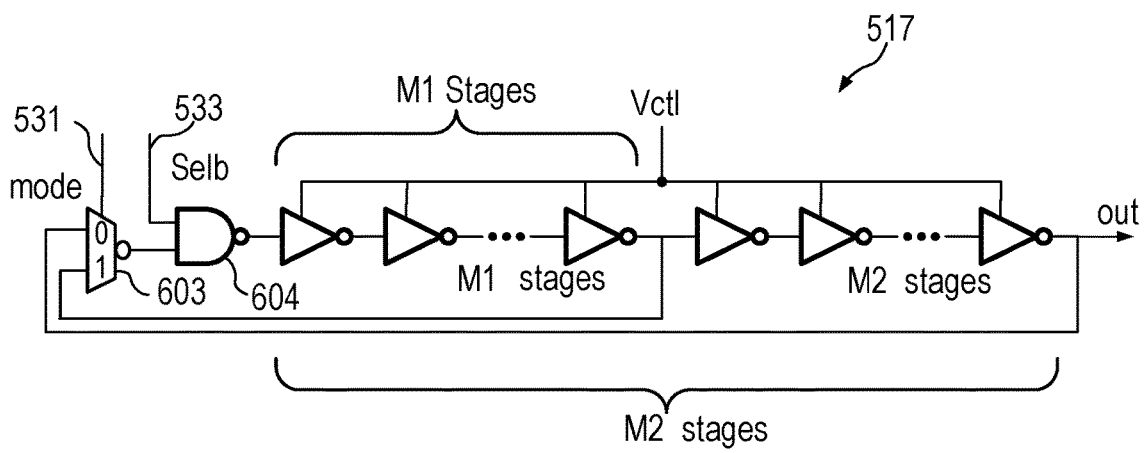
Fig. 6b
| VCO settings | | | | | |
|---|---|---|---|---|---|
| sel | mode | VCO | Oscillator configuration | Oscillation frequency | Application |
| 1 | 0 | $VCO_1$ | more inverter stages | low | low-rate, low jitter |
| 1 | 1 | $VCO_1$ | less inverter stages | high | full-rate, low jitter |
| 0 | 0 | $VCO_2$ | more inverter stages | low | low-rate, low power |
| 0 | 1 | $VCO_2$ | less inverter stages | high | full-rate, low power |
Fig. 7

PLL FOR CONTINUOUS-TIME DELTA-SIGMA MODULATOR BASED ADCS

CROSS-REFERENCE TO RELATED APPLICATION(S)

This application relates to the application entitled "Charge Pump and Active Loop Filter With Shared Unity Gain Buffer", naming Abdulkerim L. Coban as inventor, application Ser. No. 16/369,249, filed the same day as the present application, which application is incorporated herein by reference in its entirety.

BACKGROUND

Field of the Invention

This disclosure relates to generating clock signals and more particularly generating clock signals in a PLL with different power and jitter settings.

Description of the Related Art

Continuous-time delta-sigma modulator based analog to digital converters (ADCs) are widely used in radio frequency (RF) receiver (RX) applications. Typically, either higher-order delta-sigma modulator-based ADCs that use the reference clock (e.g., a crystal oscillator) or less complicated lower-order delta-sigma ADCs with high clock rates are employed. For the second case, in one solution clocks for the ADC are generated from divided down local oscillator (LO) clocks. However, the LO clock signal can change based on the tuned channel resulting in the ADC sampling frequency changing, thereby complicating modem design. Another approach uses a phase-locked loop (PLL) circuit as a clock multiplier unit for the ADC. Typically, these PLLs are not optimized for the delta-sigma ADCs and therefore consume high power and occupy large die area, increasing cost.

SUMMARY OF EMBODIMENTS OF THE INVENTION

A phase-locked loop (PLL) can be used to independently provide a fixed rate clock for the ADC in the RX signal chain, thereby simplifying modem design.

In one embodiment, an apparatus includes a phased-locked loop (PLL) that supplies a PLL output signal. The PLL includes a first oscillator supplying a first oscillator signal with a first jitter component and a second oscillator supplying a second oscillator signal with a second jitter component. The second jitter component is higher than the first jitter component. A selector circuit selects either the first oscillator signal or the second oscillator signal as the PLL output signal.

In an embodiment, the first oscillator is selected to provide the PLL output signal with a first frequency and the second oscillator is selected to provide the PLL output signal with a second frequency, the first frequency being higher than the second frequency.

In an embodiment, the first oscillator utilizes a first amount of power to supply the first oscillator signal as the PLL output signal and second oscillator utilizes a second amount of power to supply the second oscillator signal the PLL output signal, and the first amount of power being more than the second amount of power.

In an embodiment, a delta-sigma modulator analog-to-digital converter (ADC) receives the PLL output signal as an input clock signal.

In another embodiment, a method includes selecting in a selector circuit to supply as a phased-locked loop (PLL) output signal either a first oscillator output signal from a first oscillator or a second oscillator output signal from a second oscillator, the first oscillator output signal having a lower jitter component than the second oscillator output signal.

In an embodiment, the first oscillator output signal has a first frequency when supplied as the PLL output signal and the second oscillator output signal has a second frequency when supplied as the PLL output signal and the first frequency is higher than the second frequency. In an embodiment, the first oscillator utilizes a first amount of power to supply the PLL output signal at the first frequency and the second oscillator utilizes a second amount of power to supply the PLL output signal at the second frequency and the first amount of power is greater than the second amount of power.

In an embodiment the PLL output signal is supplied as an input clock signal to a continuous time delta-sigma modulator analog-to-digital converter (ADC). In an embodiment, selection of the first or the second oscillator is based on a frequency requirement for the input clock signal.

In an embodiment the first oscillator is selected responsive to a first gain setting for an amplifier used in a radio frequency (RF) receive signal chain that includes the delta-sigma modulator ADC. The second oscillator is selected responsive to a second gain setting for the amplifier, the first gain setting being higher than the second gain setting.

In another embodiment, an apparatus includes an amplifier coupled to receive an input signal and supply an amplifier output signal amplified according to a gain setting. A delta-sigma modulator analog-to-digital converter (ADC) is coupled to the amplifier output signal. A phased-locked loop (PLL) supplies a PLL output signal. The PLL includes a charge pump and loop filter supplying an oscillator control signal. A first oscillator is coupled to the oscillator control signal and configured to supply a first oscillator signal with a first jitter component. A second oscillator is coupled to the oscillator control signal and configured to supply a second oscillator signal with a second jitter component. A selector circuit selects either the first oscillator signal or the second oscillator signal as the PLL output signal according to a select signal.

BRIEF DESCRIPTION OF THE DRAWINGS

The present invention may be better understood, and its numerous objects, features, and advantages made apparent to those skilled in the art by referencing the accompanying drawings.

FIG. 6a illustrates a block diagram of one of the PLL VCOs implemented as a ring oscillator according to an embodiment.

FIG. 6b illustrates a block diagram of another of the PLL VCOs implemented as a ring oscillator according to an embodiment.

FIG. 7 illustrates various possible settings for the VCOs illustrated in FIGS. 6a and 6b.

The use of the same reference symbols in different drawings indicates similar or identical items.

DETAILED DESCRIPTION

Figure 1A:
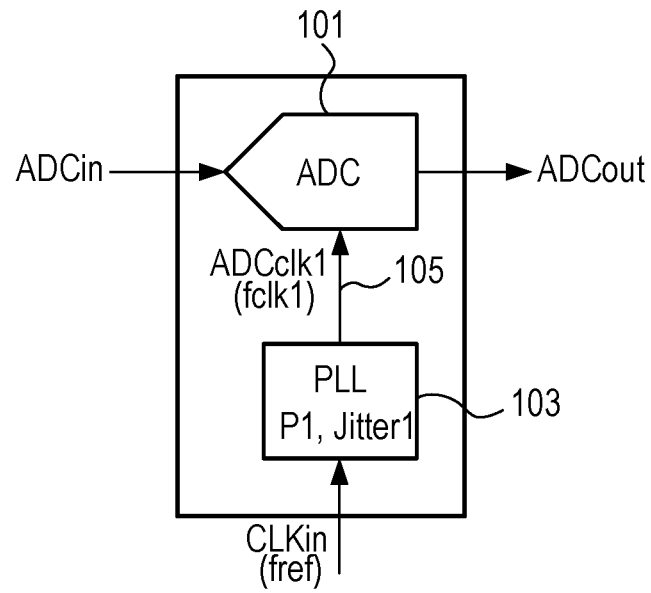
FIG. 1a illustrates a PLL supplying a clock signal to an ADC operating in full-rate mode.

Embodiments described herein provide a phase-locked loop (PLL) specifically targeted for clock generation for a continuous time delta sigma modulator ADC in an RF RX signal chain. For a given power budget, the PLL minimizes far-out phase noise at the expense of more relaxed close in phase-noise. The PLL can be used for other applications as well. Embodiments provide for a variable power dissipation PLL in which PLL power dissipation is selected based on requirements for the ADC. PLL power can be scaled e.g., based on the input signal strength to the RX signal chain and/or based on the clock rate needed by the ADC. Embodiments provide a fixed-rate clock to the ADC avoiding the complexity of using a divided down LO clock, thereby simplifying modem design.

In one embodiment, ADC clock rates are approximately 307.2 MHz for a 2 MHz bandwidth case. The ADC noise bandwidth of integration of 2 MHz is intended mainly for Zigbee® applications. An ADC clock rate around 153.6 MHz for bandwidths around 1 MHz is mainly intended for Bluetooth® applications, however both bandwidth settings can, in general, be used in with a wide range of data rates, e.g., 100 kbps to 2 Mbps FSK modulated signals and lower. Some embodiments assume a 38.4 MHz crystal frequency. Jitter limited signal to noise ratio (SNR) is mostly dependent on quantization noise folding in-band due to high-frequency jitter. As is known in the art, jitter is deviation of the clock signal edge from its ideal position. A higher clock rate demands lower jitter in the PLL (e.g., twice the frequency requires jitter to be two times lower, assuming the shape of the noise transfer function (NTF) is just frequency scaled, e.g., NTF scaled down by 2× by doubling the loop-filter capacitor sizes). Note that for a PLL intended for clock generation for continuous-time delta-sigma modulators, minimizing PLL high-frequency jitter is more important than overall jitter optimization and therefore embodiments can focus on efficient voltage control oscillator (VCO) design, keeping charge pump (CP), loop-filter, phase frequency detector (PFD), and feedback divider area and/or power low. Therefore, embodiments are driven to reduce high frequency jitter as low frequency jitter is not as important for certain applications. Embodiments utilize a clock frequency scaling scheme for full-rate and half-rate ADC operation. In half-rate mode the ADC clock frequency is scaled down by two times compared to the full-rate mode. However, frequency adjustment is not done through a VCO output divider. Instead the feedback divider ratio is scaled down by 2 and a lower power VCO is utilized in place of the VCO utilized for full-rate operation. Since the jitter requirements of the ADC is relaxed in half-rate mode that approach results in lower overall power consumption.

In addition, in principle, the jitter numbers can be relaxed when the input signal power is high, detected, e.g., by RX gain back-off. Low jitter is needed especially when the input signal level is close to sensitivity levels. The sensitivity level being the level at which acceptable signal detection occurs. For larger input signals (higher SNR), the allowed jitter can be higher. Therefore, embodiments use a PLL power scaling technique based on received signal power. When the signal chain gain is backed-off from its maximum value to at or below a threshold gain setting, the full-rate VCO is replaced with a low-power version (which has higher jitter). Utilizing the lower power VCO with higher jitter when signal power is high saves power.

Figure 1B:
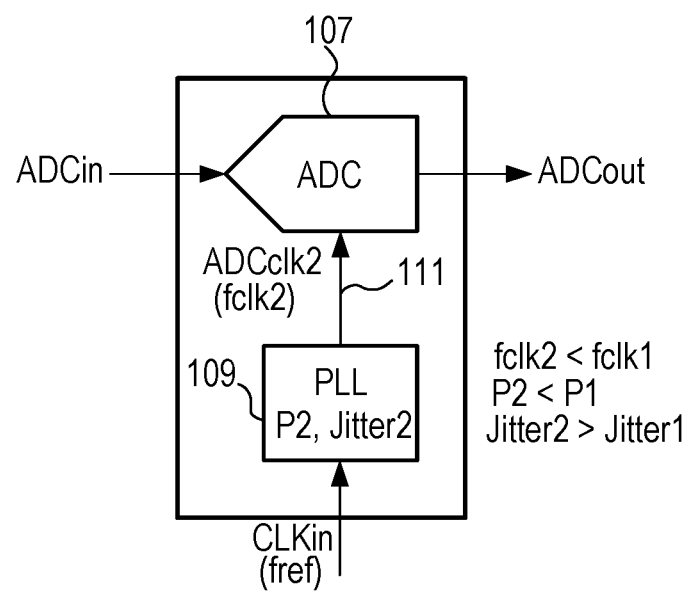
FIG. 1b illustrates a PLL supplying a clock signal to an ADC operating in less than full-rate mode.

If the ADC noise transfer function is 1-1 scaled when the clock frequency is lowered (e.g., fclk=320 MHz is lowered to fclk=160 MHz), the jitter specifications can be relaxed by the same or a similar amount. That is, with a lower clock frequency, twice as much jitter can be tolerated. That allows use of a lower power PLL generating an output signal having a higher jitter content. Referring to FIG. 1a, assuming the ADC 101 is at full rate a PLL 103 (also referred to as a clock multiplier unit (CMU) as it scales up the input reference clock) having a power utilization of P1 and a jitter specification of Jitter1 supplies ADC clock 105 that has a frequency of fclk1. The PLL 103 multiplies the reference clock signal CLKin, having a frequency of fref, to obtain ADC clock 105 with a frequency of fclk1. The PLL multiplies the reference clock CLKin by a multiple N based on the feedback divider. Thus, the frequency (fclk) of the ADC clock=N×fref. Referring to FIG. 1b, if the clock frequency requirement for ADC 107 is lowered, e.g., from 320 MHz to 160 MHz, a lower power PLL 109 supplies the ADC clock 111 (ADCclk2) having a frequency fclk2. The PLL 109 multiplies the reference clock signal CLKin, having a frequency of fref, to obtain ADC clock 111 with a frequency of fclk2. The PLL 109 has a power utilization of P2 and a jitter specification of Jitter2. The frequency fclk2<fclk1, and the power utilization P2<P1. Thus, a lower power PLL can be utilized that supplies a lower frequency ADC clock that has a higher jitter component. This jitter, as mentioned above, still meets the ADC requirements.

Figure 2C:
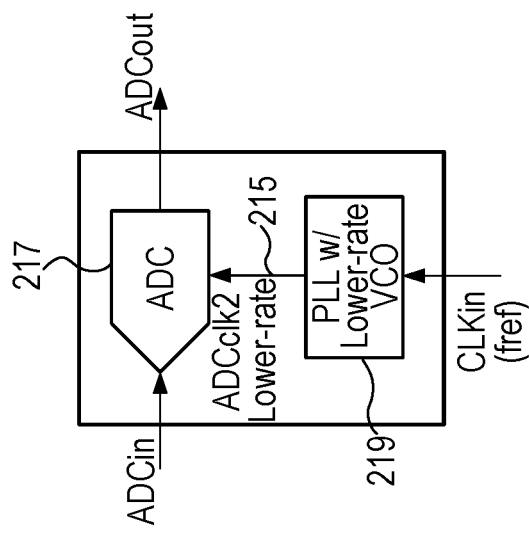
FIG. 2c illustrates a PLL with a lower-rate VCO supplying a lower rate clock signal to an ADC without the use of a divider.
Figure 2B:
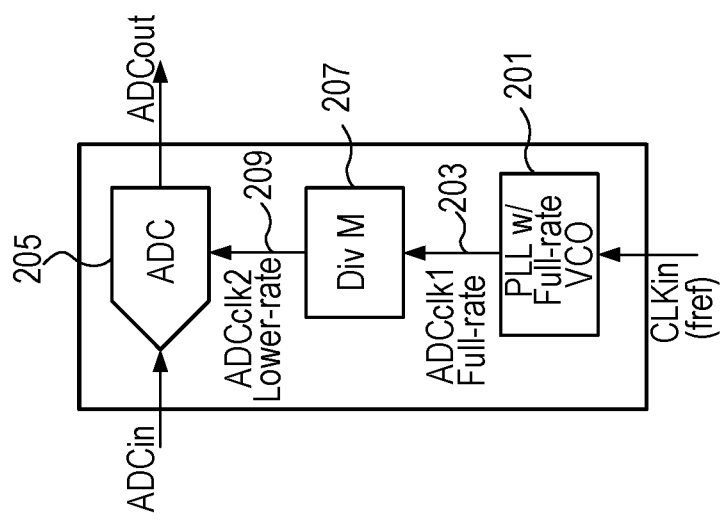
FIG. 2b illustrates a PLL with a full-rate VCO and a divider on the PLL output to supply a lower rate clock signal to an ADC.
Figure 2A:
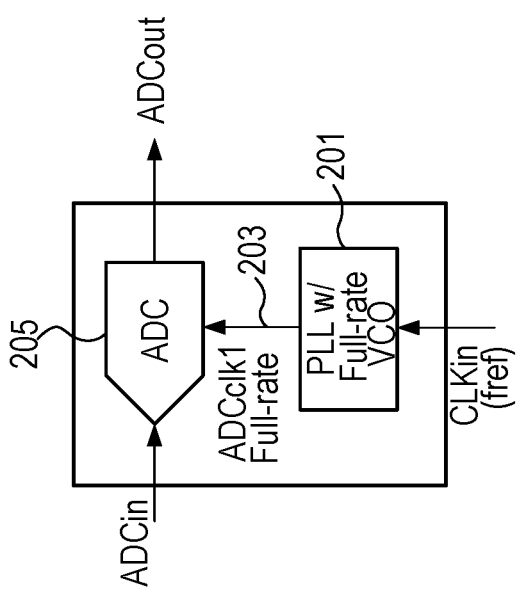
FIG. 2a illustrates a PLL with a full-rate VCO supplying a full rate clock signal to an ADC.

Referring to FIG. 2a, the illustrated embodiment utilizes a PLL 201 with a full rate VCO to supply a full rate ADC clock (ADCclk1) 203 to ADC 205. FIG. 2b illustrates that an output divider 207 can be used in conjunction with PLL 201 with a full rate VCO to supply an ADC clock (ADclk2) 209 that has a lower frequency than the ADC clock (ADCclk1) 203. However, the approach of FIG. 2b requires use of the PLL 201 with a full rate VCO and a divider 207, which consumes unnecessary power. FIG. 2c illustrates an embodiment that provides a lower rate clock 215 to ADC 217 directly from PLL 219 that utilizes a lower rate VCO. The PLL 219 uses a lower power VCO specifically designed to supply the lower rate ADC clock. The PLL 219 utilizes less power than the PLL 201 and the divider 207 is completely omitted from the embodiment shown in FIG. 2c, thus saving additional power.

Figure 3A:
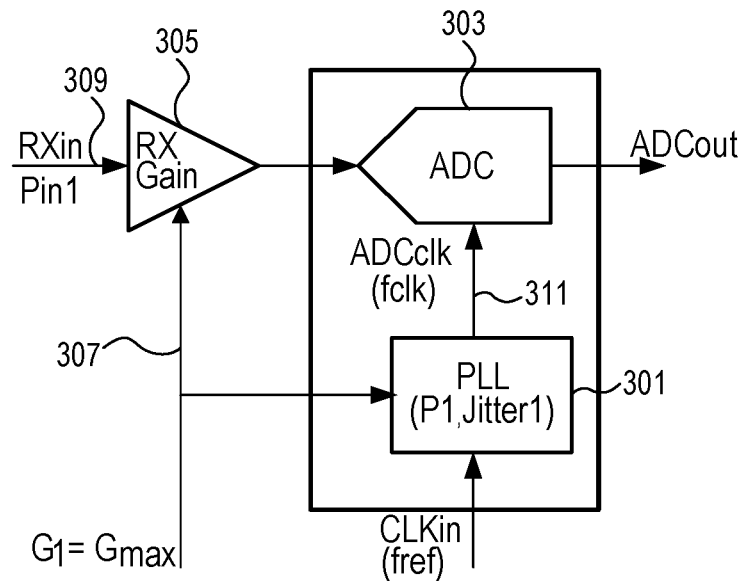
FIG. 3a illustrates an RX signal chain including an amplifier and an ADC in which the PLL supplying a clock signal to the ADC is configured for the amplifier gain being set to maximum.

In embodiments, PLL power scaling is based on the power of the input signal. Referring to FIG. 3a, the PLL 301 and ADC 303 function as part of the RX signal chain. The signal chain includes a receive amplifier 305 having a gain setting set by gain control signal 307. Note that gain block 305 represents the various gain blocks in a typical receiver (e.g., gains of the front-end passive network, low noise amplifier (LNA) and programmable gain amplifier (PGA)) as a single block for illustration purposes. The gain setting provides information indicating whether the power level of input signal 309 is close to a sensitivity level Psens or not. That is, if the input signal power Pin is such that the input signal is close to the minimum signal power sensitivity level Psens required to accurately sense the input signal, the gain setting for amplifier 301 is set to a maximum gain factor G1 (G1=Gmax). With the gain factor set to G1, which corresponds to the maximum gain, the system uses PLL 301 consuming power P1 and producing a clock signal with a jitter Jitter1.

Figure 3B:
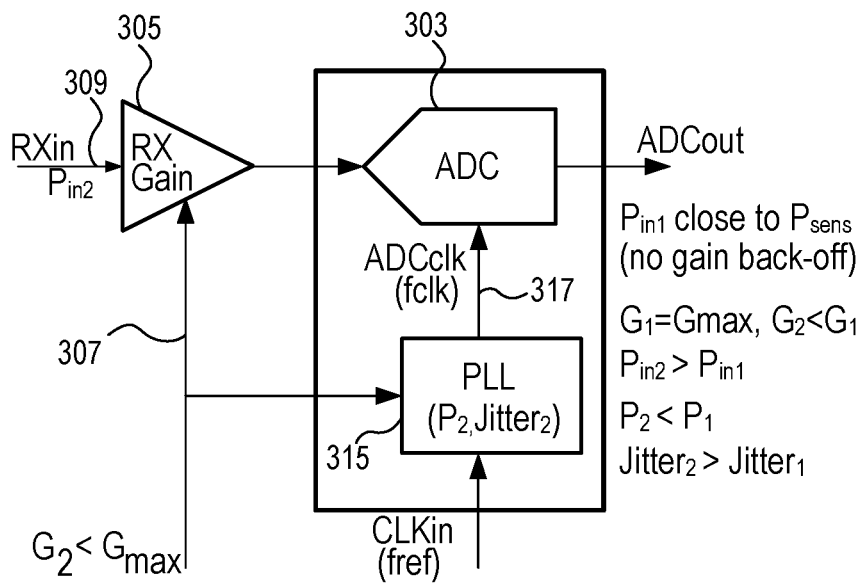
FIG. 3b illustrates an RX signal chain including an amplifier and the ADC in which the PLL supplying a clock signal to the ADC is configured for the amplifier gain being set to less than maximum.

However, if Pin>Psens (e.g., by at least several dBs), the amplifier gain signal 307 is reduced to reduce the gain of amplifier 305. The reduced gain setting indicates that the jitter specifications can be relaxed as overall Quantization+ Thermal noise limited SNR is increased. That means that a clock signal with a greater jitter component can be tolerated by the ADC. In that circumstance, the system switches to a lower power VCO. Referring to FIG. 3b, if the gain for amplifier 305 is set at G2<Gmax, then the system uses PLL 315 with a power utilization of P2 and a jitter equal to Jitter2, Jitter2>Jitter1. In addition, the power of the input signal Pin2>Pin1, allowing a smaller gain factor G2<Gmax. The smaller gain factor indicates that the PLL 315 can use a VCO that produces a clock signal having a higher jitter component. Thus, the PLL 315 supplies a clock signal 317 having the same frequency (fclk) as clock signal 311 (FIG. 3a), but more jitter. The use of a higher jitter clock signal allows the use of a lower power PLL.

Figure 4:
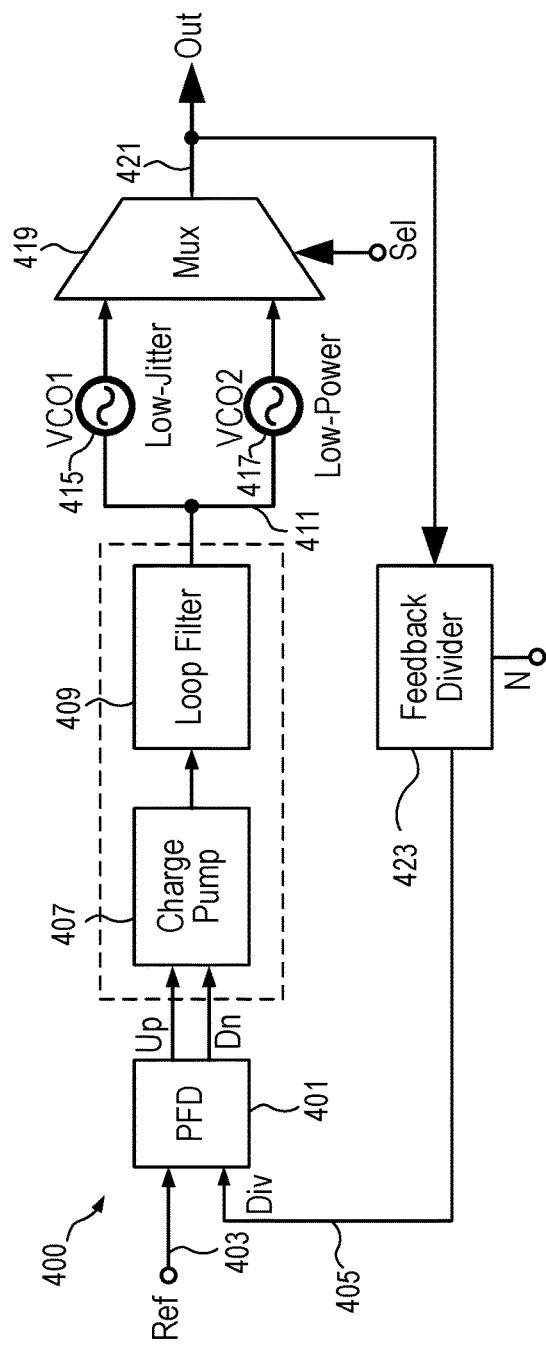
FIG. 4 illustrates a block diagram of a PLL with multiple VCOs according to an embodiment.

FIG. 4 illustrates a block diagram of a PLL (or CMU) 400 according to an embodiment. The PLL 400 includes a phase and frequency detector (PFD) 401 that compares the reference clock 403 to the feedback clock 405 and supplies an UP or DN signal based on the comparison to a charge pump 407. The charge pump supplies a loop filter 409, which supplies an oscillator control signal 411 to a low-jitter oscillator (VCO1) 415 and to a low power oscillator (VCO2) 417. A selector circuit 419 selects either the output of VCO1 415 or VCO2 417 as the output clock signal 421 for the PLL 400. Thus, rather than using separate PLLs, a single PLL selects between VCOs to achieve the desired power and jitter. The output clock signal 421 is fed back through feedback divider 423 to PFD 401. The feedback divider 423 divides the PLL output signal by N, and supplies the divided signal 405 to PFD 401. The selection of either VCO1 415 or VCO2 417 as the output clock signal depends on the proximity of the input signal power to the sensitivity level and/or whether the ADC is run at half rate or full rate.

While two VCOs are shown in the embodiment of FIG. 4, other embodiments may use additional VCOs. For example, in an embodiment, a third VCO has a power consumption and jitter specification between VCO1 and VCO2. The third VCO is selected, e.g., when the input signal power is above a predetermined level but not enough dBs above the sensitivity level (high enough SNR) to warrant the higher jitter present in the low power VCO2 but can still tolerate more jitter than the low-jitter VCO1 and thus achieve some power savings. The third VCO is also selected, e.g., in embodiments where the ADC runs at a rate between full rate and half rate. In embodiments the VCO(s) not being used are powered down. For example, VCO1 is powered down when VCO2 is being used and VCO2 is powered down when VCO1 is being used.

Figure 5:
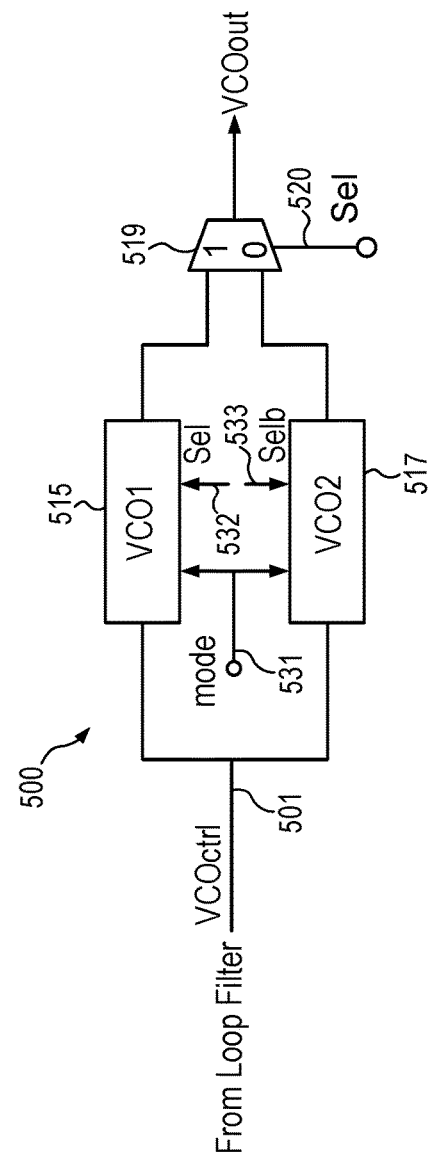
FIG. 5 illustrates a portion of a PLL illustrating control signals for the multiple VCOs.

FIG. 5 illustrates a high level block diagram of a portion of a PLL 500 according to an embodiment. The loop filter supplies an oscillator control signal 501 to VCO1 515 and to VCO2 517. The selector circuit 519 selects the output signal from one of the VCOs as the PLL output signal according to the select signed Sel 520. The oscillators receive a mode signal 531 and VCO1 receives the select signal Sel 532 and VCO2 receives the inverse of Sel (Selb) 533. The select signals 532 and 533 can be independent of select signal 520 or can be related. While two VCOs are illustrated in FIG. 5, other embodiments may use other numbers of VCOs as suitable for the particular application. Thus, embodiments may select between three VCOs with different power and jitter specifications.

FIG. 6a illustrates an exemplary block diagram of VCO1 515. The oscillator 515 is a ring oscillator based VCO with a programmable number of inverter stages. The mode signal 531 selects the delay through the ring oscillator by selecting the number of inverter stages. With the mode signal being 1, N1 stages are selected through multiplexer 601. With the mode signal at 0, N2 stages are selected where N1 and N2 are integers. The number of stages selected by the mode signal determines the frequency of the output signal supplied by VCO1 for a given control voltage, Vctl. The select signal 532 determines if the ring oscillator is active. If the select signal is zero NAND gate 602 prevents the oscillator from oscillating. If the select signal is 1, the feedback signal controls the output of NAND gate 602 and the ring oscillator oscillates.

VCO1 utilizes an inverter chain with larger device aspect ratios width/length (W/L), to provide lower jitter/phase noise. The use of inverters with larger W/L aspect ratios causes VCO1 to consume more power as compared to VCO2. VCO1 is for use for the ADC higher clock rate mode and lower jitter. For a given ADC SNR requirement, lower jitter is needed for high-speed (full-rate) ADC mode. VCO1 515 is also selected when the RX chain input power is close to the sensitivity level.

FIG. 6b illustrates an exemplary block diagram of oscillator VCO2 517. The oscillator 517 is a ring oscillator based VCO with a programmable number of inverter stages. The mode signal 531 selects the number of inverter stages. With the mode signal being 1, M1 stages are selected through multiplexer 603. With the mode signal at 0, M2 stages are selected where M1 and M2 are different integers. Note that M1 and N1 may be the same or different and M2 and N2 may be the same or different depending on the particular embodiment. The number of stages selected by the mode signal determines the frequency of the output signal supplied by VCO2 for a given control voltage, Vctl. The $\overline{\text{select}}$ signal 533 (selb) determines if the ring oscillator is active. If the $\overline{\text{select}}$ signal is zero NAND gate 604 prevents the oscillator from oscillating. Note that the select 532 is one if $\overline{\text{select}}$ is zero, thus enabling VCO1. If the $\overline{\text{select}}$ signal is 1, the feedback signal controls the output of NAND gate 604 and the ring oscillator oscillates. In an embodiment, the oscillator not being used is powered off to save power instead of just preventing the oscillator from oscillating.

VCO2 utilizes an inverter chain with smaller device aspect ratios W/L as compared to VCO1, to consume less power as compared to VCO1 at the expense of higher jitter. VCO2 is used for the lower clock rate ADC mode. For a given ADC SNR requirement, at lower clock rates higher jitter can be tolerated. Therefore, VCO2 517 is utilized for half rate ADC mode when higher jitter is tolerated and a lower power VCO can be utilized. VCO2 517 is also utilized and when the RX chain input power is high (a threshold number of dB above the sensitivity level).

While FIGS. 6a and 6b illustrate ring oscillators, other embodiments may use different types of oscillators for VCO1 and VCO2. For example, in another embodiment the oscillators are LC oscillators providing different power consumption and jitter levels.

FIG. 7 illustrates various possible settings for the VCOs illustrated in FIGS. 6a and 6b. Assertion of the select signal (Sel) 532 selects the VCO1. With the mode=0, the VCO1 is configured to have more inverter stages resulting in a lower oscillation frequency for a given control voltage Vctl. By increasing number of inverter stages when low-rate is selected the control voltage variation across two different frequency settings is reduced. That mode and select setting (1, 0) is appropriate for low-rate, low-jitter applications. A mode and select setting of (1, 1) selects fewer inverter stages for VCO1 and is appropriate for high-rate, low-jitter applications. Deassertion of the select signal (Sel) 532 selects the VCO2. With the mode=0, the VCO2 selects more inverter stages resulting in a lower oscillation frequency for a given control voltage Vctl. Increased number of stages keeps the control voltage shift small between the two oscillation frequencies. That mode and select setting (0, 0) is appropriate for low-rate, low-power, higher jitter applications. A mode and select setting of (0, 1) configures VCO2 to have fewer inverter stages (higher frequency) and is appropriate for high-rate, higher jitter low-power applications. For example, if the input power is sufficiently above the sensitivity level, a higher level of jitter can be tolerated and a low-power VCO can be used.

Figure 8:
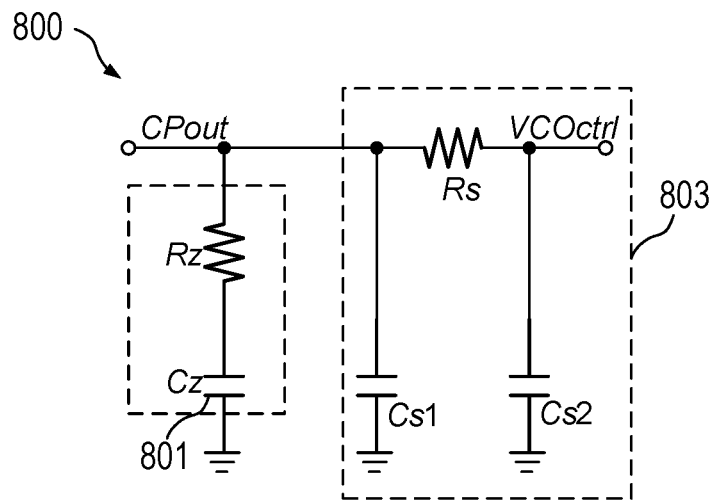
FIG. 8 illustrates a conventional loop filter topology.

Referring back to FIG. 4, components of PLL 400 include the charge pump 407 and loop filter 409. FIG. 8 illustrates a conventional loop filter topology for type-II PLLs, which also include higher order poles. The area of the capacitor Cz 801 is typically large and therefore occupies a large area. The additional circuitry 803 is included to provide higher order filtering.

Figures 9A, 9B:
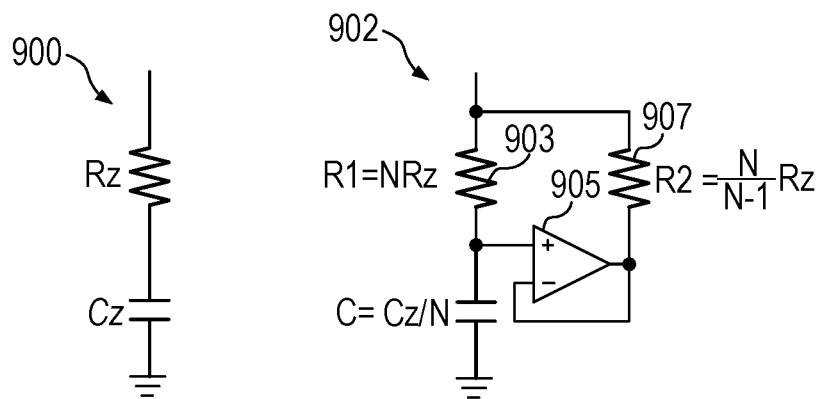
FIG. 9a illustrates a passive loop filter.
FIG. 9b illustrates an active loop filter.

FIG. 9a illustrates a passive loop filter 900 having an input impedance $Z_{in}(s)=R_z+1/sC_z$. FIG. 9b illustrates an active loop filter 902 with capacitor multiplication that reduces the size of the capacitor Cz by a factor N. The resistor 903 is sized at R1=NRz, where Rz is the resistor in FIG. 9a. The active loop filter 902 further includes a unity gain buffer 905. The unity gain buffer is an amplifier that functions to cause the output voltage to equal the input voltage, i.e., the unity gain buffer is an amplifier with a gain of one. In the active filter 902, resistor 907 is sized as $$R2 = \frac{N}{N-1}R_z.$$

The active loop filter and the passive loop filter have the same input impedance. That is, the active loop filter also has an input impedance $Z_{in}(s)=R_z+1/sC_z$. The use of the active loop filter allows the capacitor Cz to be reduced in size to Cz/N. Thus, the effective capacitance of the active loop filter with a capacitor C is increased by $C_{eff}=C(1+R1/R2)$. A large N (e.g., N=10), requires a much smaller capacitor for the active filter implementation, thus providing significant capacitor area savings at the cost of additional area and power due the unity gain buffer, additional resistor 907, and larger resistor 903. Resistor area overhead, however, is small as resistors in a loop filter implementation have much smaller area than that of capacitor Cz. In various embodiments, the PLL 400 includes the loop filter 800 (FIG. 8), the loop filter 900, or the loop filter 902, or any appropriate loop filter to generate a control signal to control the VCOs depending on the requirements of the particular application.

Figure 10A:
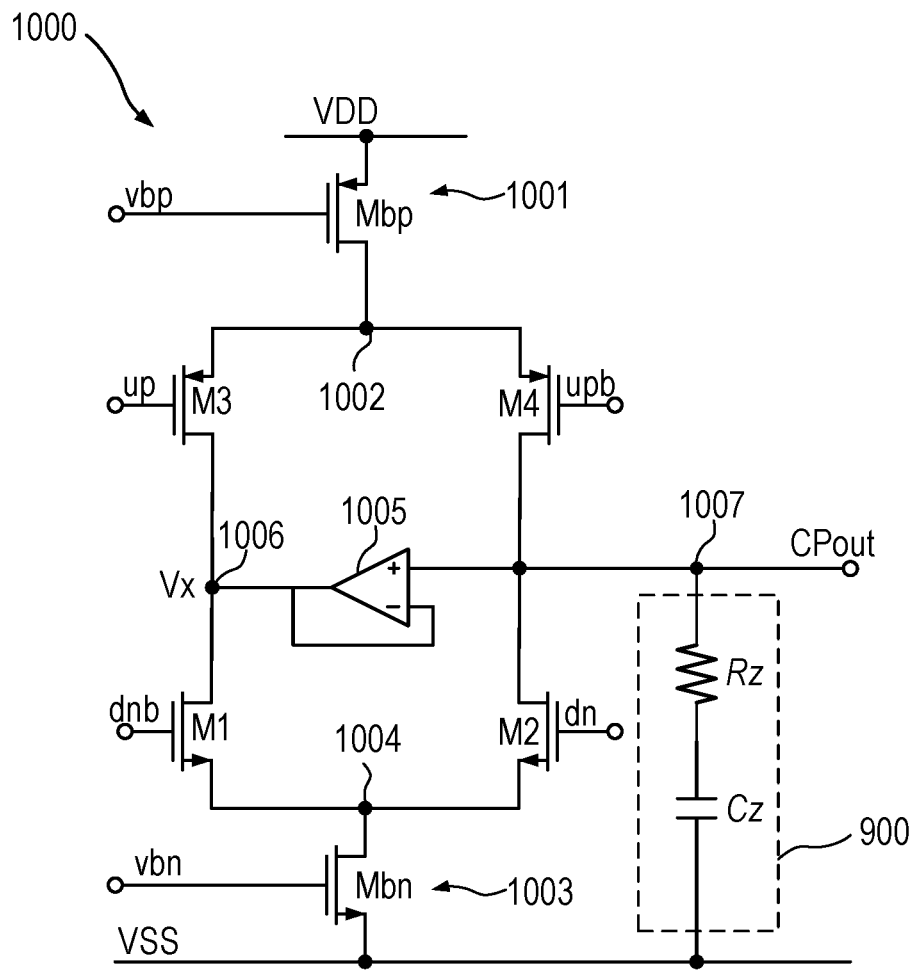
FIG. 10a illustrates a conventional charge pump.
Figure 10B:
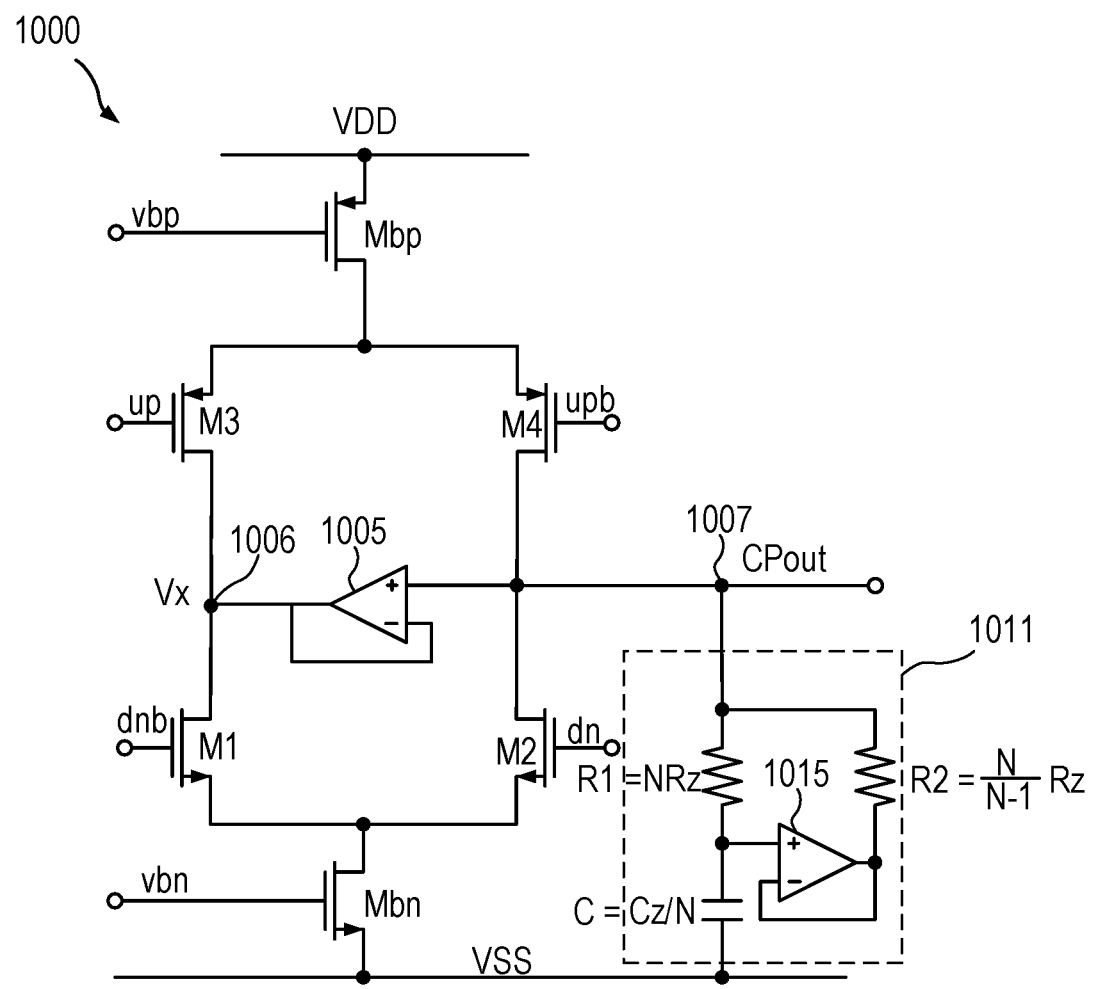
FIG. 10b illustrates a charge pump and active loop filter.

In addition to the loop filter, the PLL 400 illustrated in FIG. 4 includes a charge pump 407. FIG. 10a illustrates a conventional implementation of a push-pull charge pump 1000 used in an embodiment of PLL 400. The current sources 1001 and 1003 increase or decrease the charge supplied according to the UP and DN signals supplied from PFD 401 (see FIG. 4). The UP and DN signals and their complement are supplied as dnb, dn, up, and upb to respectively control the transistors M1, M2, M3, and M4. The transistors M4 and M2 control the charging or discharging, respectively, of the charge stored in the loop filter capacitor of loop filter 900. Note that transistor pairs M4 and M3 are PMOS transistors controlled (turned ON) by active low gate control signals. The transistors pairs M1 and M2 are NMOS transistors controlled (turned ON) by active high gate control signals. When one transistor of the pair is off, the other of the pair is on. Thus, e.g., when both upb is high and dn is low, and up is low and dnb is high, transistors M3 and M1 are on providing a path between nodes 1002 and 1004. When only upb is asserted (active low) the loop filter capacitor Cz is charged through M4 and transistor M1 is on providing a path between node 1006 and 1004. When only dn is asserted the loop filter capacitor Cz is discharged through M2 and transistor M3 is on providing a path between nodes 1002 and 1006. The unity gain buffer 1005 forces the voltage Vx at node 1006 to follow the voltage on the CPout node 1007 thereby helping minimize offset currents. While FIG. 10a shows a simple passive loop filter 900, other embodiments use a higher order loop filter such as the loop filter 800 shown in FIG. 8. While passive loop filters are used in various embodiments, FIG. 10b illustrates an embodiment in which an active loop filter 1011 is used in an embodiment with a unity gain buffer 1015. That allows use of a smaller capacitor (Cz/N).

Figure 11:
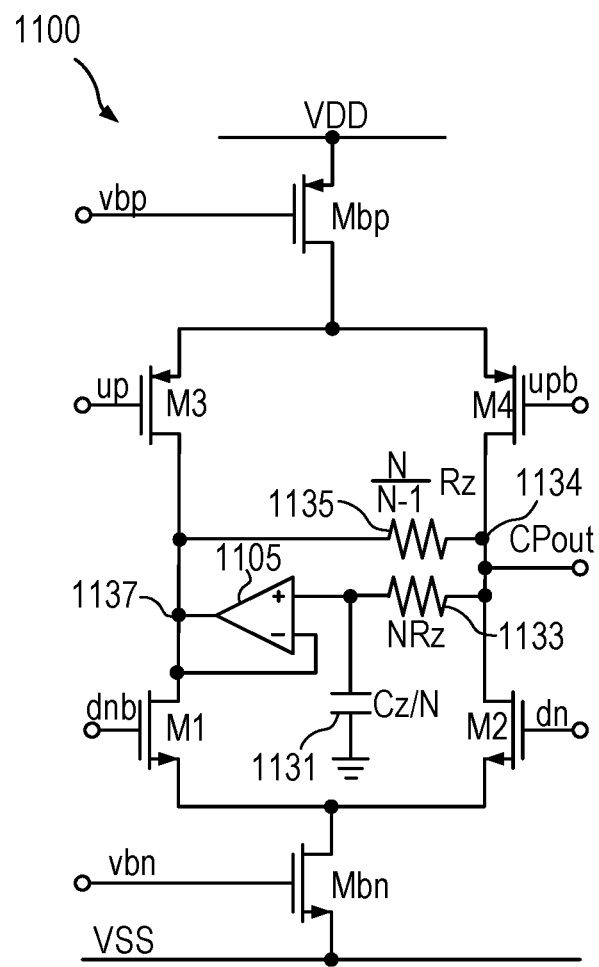
FIG. 11 illustrates a charge pump and loop filter topology according to an embodiment with a shared unity gain buffer.

FIG. 11 illustrates an embodiment having a new charge pump and active loop filter topology 1100 with lower overhead in power and area. The topology can be used in various embodiments described herein but can also be used in PLLs intended for other applications to save area and power. The new charge-pump and loop-filter implementation can reduce loop filter area while keeping overall charge pump and active loop filter current low due to shared use of the unity gain buffer as described below. The embodiment in FIG. 11 includes a charge pump and active loop filter 1100 in which the unity gain buffer 1105 is shared by the charge pump and loop filter, thereby reducing area needed and power consumed by the charge pump and looper filter. In the charge pump and loop filter 1100, with reference also to FIGS. 9b and 10b, resistor 1133 functions as the loop filter R1=NRz resistor. Resistor 1135 functions as the resistor $$R2 = \frac{N}{N-1}R_z$$

and capacitor 1131 is Cz/N. Thus, the unity gain amplifier 1105 functions as part of the active loop filter allowing the capacitance area of the capacitor 1131 to be reduced as compared to a passive loop filter implementation. The unity gain buffer 1105 also forces the voltage at node 1137 to follow the output voltage CPout on node 1134 to thereby minimize offset currents in the charge pump. Note that FIG. 11 differs somewhat from FIG. 10b. For example, in FIG. 10b there is no resistor, e.g., resistor 1133, in series between the positive input of the unity gain buffer and CPout. However, for the intended purpose (node 1137 to follow node 1134) the circuit of FIG. 11 is effective. At DC a capacitor is an open circuit therefore the two approaches are identical at low frequencies. Vx (node 1137) on average needs to follow the output (CPout, node 1134) and that is achieved in FIG. 11.

Figure 12:
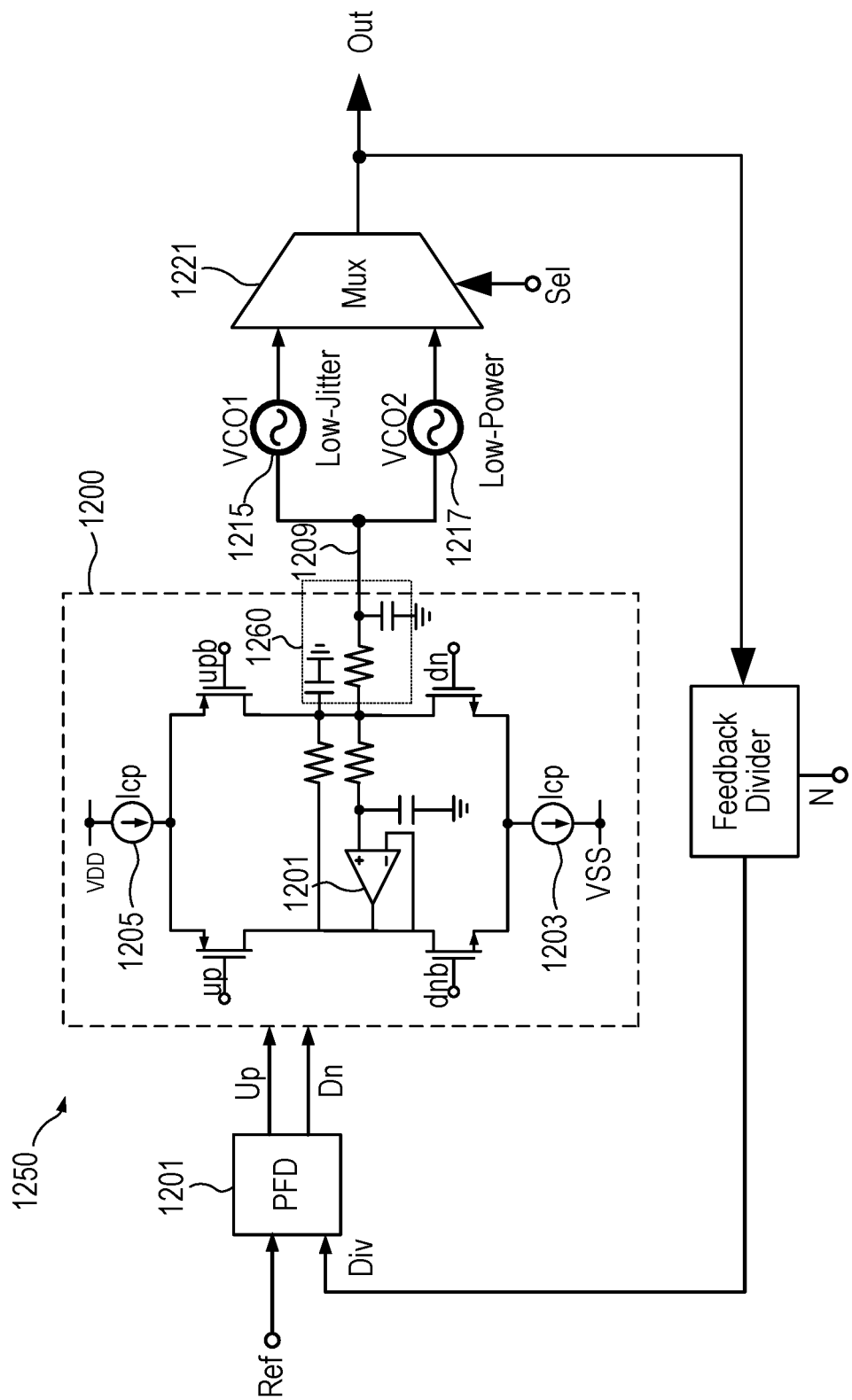
FIG. 12 illustrates use of a charge pump and loop filter topology in an embodiment of a PLL with multiple VCOs.

FIG. 12 illustrates an embodiment of a PLL 1250 in which the charge pump 407 and loop filter 409 of FIG. 4 are replaced by charge pump/loop filter topology 1200 with the shared unity gain buffer 1201. The charge pump/loop filter 1200 is the same as charge pump/loop filter 1100 except that the current sources 1203 and 1205 are shown more symbolically in charge pump/loop filter 1200. In the embodiment of FIG. 12, the loop filter includes the higher order filtering components 1260. The charge pump/loop filter 1200 supplies the VCO control signal 1209 to VCOs 1215 and 1217, one of which is selected by multiplier 1221 to supply the PLL output signal.

Figure 13:
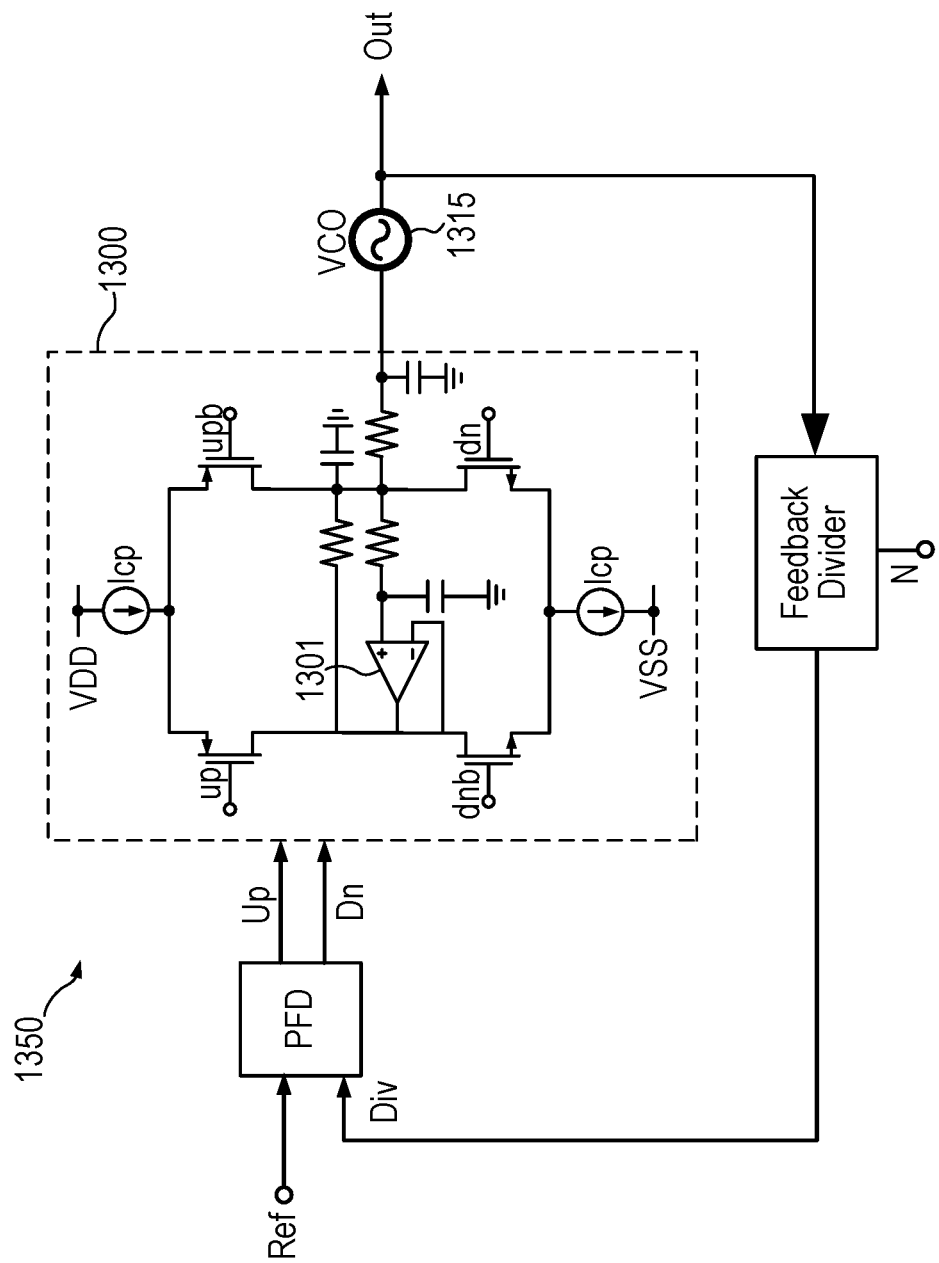
FIG. 13 illustrates use of a charge pump and loop filter topology in an embodiment of a PLL with a single VCO.

FIG. 13 illustrates an embodiment in which the charge pump/loop filter 1300 with the shared unity gain buffer 1301 controls a single VCO 1315 in PLL 1350.

Thus, various aspects have been described related to a PLL that utilizes VCOs with different jitter and power specifications. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An apparatus comprising:
 a phased-locked loop (PLL) supplying a PLL output signal, the PLL including,
   a first oscillator supplying a first oscillator signal;
   a second oscillator supplying a second oscillator signal;
   a selector circuit to select the first oscillator signal or the second oscillator signal as the PLL output signal;
 a continuous-time delta-sigma modulator analog-to-digital converter (ADC) coupled to receive the PLL output signal as an input clock signal;
 an amplifier coupled to an input signal and configured to supply an amplifier output signal to the delta sigma modulator ADC;
 a gain control signal coupled to control a gain of the amplifier; and
 wherein the first oscillator is selected responsive to a first value of the gain control signal and the second oscillator is selected according to a second value of the gain control signal.

2. The apparatus as recited in claim 1, further comprising a loop filter coupled to the first oscillator and the second oscillator.

3. The apparatus as recited in claim 1,
 wherein the first oscillator signal has a first jitter component and the second oscillator signal has a second jitter component and the second jitter component is higher than the first jitter component.

4. The apparatus as recited in claim 1,
 wherein the first oscillator utilizes a first amount of power to supply the first oscillator signal as the PLL output signal; and
 wherein the second oscillator utilizes a second amount of power to supply the second oscillator signal the PLL output signal, the first amount of power being more than the second amount of power.

5. The apparatus as recited in claim 1,
 wherein the first value of the gain control signal is higher than the second value of the gain control signal.

6. The apparatus as recited in claim 1,
 wherein the first oscillator is a ring oscillator, and the first oscillator includes a first plurality of inverters with transistors having a first width to length aspect ratio; and
 wherein the second oscillator is a ring oscillator, and the second oscillator includes a second plurality of inverters with transistors having a second width to length aspect ratio, the second width to length aspect ratio being smaller than the first width to length aspect ratio;
 and wherein the first oscillator consumes more power than the second oscillator.

7. The apparatus as recited in claim 6, wherein respective numbers of inverter stages in the first oscillator and the second oscillator are selectable.

8. A method comprising:
 selecting in a selector circuit to supply as a phased-locked loop (PLL) output signal either a first oscillator output signal from a first oscillator or a second oscillator output signal from a second oscillator;
 supplying the PLL output signal as an input clock signal to a continuous time delta-sigma modulator analog-to-digital converter (ADC);
 selecting the first oscillator responsive to a first gain setting for an amplifier used in a radio frequency (RF) receive signal chain that includes the delta-sigma modulator ADC; and
 selecting the second oscillator responsive to a second gain setting for the amplifier, the first gain setting being higher than the second gain setting.

9. The method as recited in claim 8, further comprising:
 the first oscillator utilizing a first amount of power to supply the first oscillator output signal as the PLL output signal; and
 the second oscillator utilizing a second amount of power to supply the second oscillator output signal as the PLL output signal, the first amount of power being greater than the second amount of power.

10. The method as recited in claim 8, further comprising:
 providing a first plurality of inverters with transistors having a first width to length aspect ratio in the first oscillator; and
 providing a second plurality of inverters with transistors having a second width to length aspect ratio in the second oscillator, the second width to length aspect ratio being smaller than the first width to length aspect ratio.

11. The method as recited in claim 8, further comprising:
using an output of a loop filter to control the first oscillator and the second oscillator.

12. The method as recited in claim 8, further comprising:
selecting between a first number of inverter stages and a second number of inverter stages in the first oscillator to thereby select between two frequencies of the first oscillator output signal; and
selecting between a third number of inverter stages and a fourth number of inverter stages in the second oscillator to thereby select between two frequencies of the second oscillator output signal.

13. An apparatus comprising:
an amplifier coupled to receive an input signal and supply an amplifier output signal amplified according to a gain setting;
a delta-sigma modulator analog-to-digital converter (ADC) coupled to the amplifier output signal and coupled to a PLL output signal;
a phased-locked loop (PLL) supplying the PLL output signal, the PLL including, a charge pump and loop filter supplying an oscillator control signal;
a first oscillator coupled to the oscillator control signal and configured to supply a first oscillator signal with a first jitter component;
a second oscillator coupled to the oscillator control signal and configured to supply a second oscillator signal with a second jitter component; and
a selector circuit coupled to select either the first oscillator signal or the second oscillator signal as the PLL output signal according to a select signal; and
wherein the select signal selects the first oscillator responsive to a first value of the gain setting and the select signal selects the second oscillator responsive to a second value of the gain setting.

14. The apparatus as recited in claim 13 wherein the second oscillator consumes less power to supply the second oscillator signal as the PLL output signal than the first oscillator consumes to supply the first oscillator signal as the PLL output signal.

15. The apparatus as recited in claim 13 wherein the second value is less than the first value.

16. The method as recited in claim 8 wherein the first oscillator output signal has a lower jitter component than the second oscillator output signal.

\* \* \* \* \*

UNITED STATES PATENT AND TRADEMARK OFFICE
CERTIFICATE OF CORRECTION

PATENT NO. : 10,715,156 B1  
APPLICATION NO. : 16/369239  
DATED : July 14, 2020  
INVENTOR(S) : Abdulkerim L. Coban Page 1 of 1

It is certified that error appears in the above-identified patent and that said Letters Patent is hereby corrected as shown below:

In the Specification

In Column 1, Line 8-9, please replace "the same day as the present application" with --March 29, 2019--.

Signed and Sealed this  
Thirtieth Day of March, 2021

Drew Hirshfeld  
*Performing the Functions and Duties of the*  
*Under Secretary of Commerce for Intellectual Property and*  
*Director of the United States Patent and Trademark Office*